United States Patent
Wu et al.

(10) Patent No.: US 8,670,579 B2
(45) Date of Patent: Mar. 11, 2014

(54) MEMS MICROPHONE

(75) Inventors: Zhi-Jiang Wu, Shenzhen (CN); Xing-Fu Chen, Shenzhen (CN); Yong-Ze Su, Shenzhen (CN)

(73) Assignees: AAC Acoustic Technologies (Shenzhen) Co., Ltd., Shenzhen (CN); American Audio Components, Inc., La Verne, CA (US)

( * ) Notice: Subject to any disclaimer, the term of this patent is extended or adjusted under 35 U.S.C. 154(b) by 744 days.

(21) Appl. No.: 12/694,285

(22) Filed: Jan. 27, 2010

(65) Prior Publication Data

US 2010/0322443 A1  Dec. 23, 2010

(30) Foreign Application Priority Data

Jun. 19, 2009  (CN) .......................... 2009 1 0108215

(51) Int. Cl.
*H04R 25/00* (2006.01)

(52) U.S. Cl.
USPC ............................ 381/174; 381/113; 381/175

(58) Field of Classification Search
USPC .......... 257/415, 416, 704, 724, 729; 381/174, 381/355, 361, 369
See application file for complete search history.

(56) References Cited

U.S. PATENT DOCUMENTS

| | | | | |
|---|---|---|---|---|
| 7,023,066 B2* | 4/2006 | Lee et al. | ....... | 257/415 |
| 7,054,458 B2* | 5/2006 | Ito et al. | ....... | 381/355 |
| 7,166,910 B2* | 1/2007 | Minervini | ....... | 257/704 |
| 7,242,089 B2* | 7/2007 | Minervini | ....... | 257/704 |
| 7,260,230 B2* | 8/2007 | Feng | ....... | 381/174 |
| 7,466,834 B2* | 12/2008 | Ogura et al. | ....... | 381/174 |
| 8,144,898 B2* | 3/2012 | Feng | ....... | 381/174 |
| 2005/0053254 A1* | 3/2005 | Kim | ....... | 381/369 |
| 2006/0280320 A1* | 12/2006 | Song et al. | ....... | 381/174 |
| 2009/0209121 A1* | 8/2009 | Kim et al. | ....... | 439/83 |
| 2010/0183174 A1* | 7/2010 | Suvanto et al. | ....... | 381/174 |
| 2010/0195864 A1* | 8/2010 | Lutz et al. | ....... | 381/433 |

* cited by examiner

*Primary Examiner* — Davetta W Goins
*Assistant Examiner* — Phylesha Dabney
(74) *Attorney, Agent, or Firm* — James J. Zheng, Esq.

(57) ABSTRACT

A MEMS microphone includes a cover, a housing engaging with the cover for forming a cavity, at least one transducer accommodated in the cavity, and a conductive case covering the cover and the sidewall of the housing. The housing includes a cover and a sidewall extending from the base. The conductive case defines a first part covering the cover, a second part extending from the first part for covering the sidewall and a third part perpendicularly extending from the second part for covering a periphery part of the base, the third part forming an opening.

6 Claims, 2 Drawing Sheets

MEMS MICROPHONE

FIELD OF THE INVENTION

The present invention relates generally to microphones. More particularly, this invention relates to a microelectromechanical (MEMS) microphone.

DESCRIPTION OF RELATED ART

There have been a number of disclosures related to building microphone elements on the surface of a silicon die. Certain of these disclosures have come in connection with the portable device field for the purpose of reducing the size of the device. While these disclosures have reduced the size of the device, they have not disclosed how to protect the transducer from outside interferences. For instance, transducers of this type are fragile and susceptible to physical damage. Furthermore, they must be protected from light and electromagnetic interferences. For these reasons, the silicon die must be shielded.

Typically, such a MEMS microphone generally includes a MEMS die having a silicon substrate, a backplate arranged on the substrate, and a moveable diaphragm separated from the backplate for forming a capacitor. While external sound waves reach the diaphragm, the diaphragm will be activated to vibrate relative to the backplate, which changes the distance between the diaphragm and the backplate and changes the capacitance value. As a result, the sound waves are converted into electrical signals.

Such typical microphones are disclosed in U.S. Pat. No. 7,166,910 B2, U.S. Pat. No. 7,242,089 B2, and U.S. Pat. No. 7,023,066 B2. However, the shields in these patents are thin conductive layers electroplated on non-conductive layers, which increases production cost. Further, the thin conductive layers would peel off the non-conductive layers. As a result, an MEMS microphone having an improved shield is desired.

SUMMARY OF THE INVENTION

In one embodiment of the present invention, a MEMS microphone includes a cover, a housing engaging with the cover for forming a cavity, at least one transducer accommodated in the cavity, and a conductive case covering the cover and the sidewall of the housing. The housing includes a cover and a sidewall extending from the base. The conductive case defines a first part covering the cover, a second part extending from the first part for covering the sidewall and a third part perpendicularly extending from the second part for covering a periphery part of the base, the third part forming an opening.

Other features and advantages of the present invention will become more apparent to those skilled in the art upon examination of the following drawings and detailed description of exemplary embodiment.

DETAILED DESCRIPTION OF THE PREFERRED EMBODIMENT

Reference will now be made to describe the exemplary embodiment of the present invention in detail.

Figure 1:
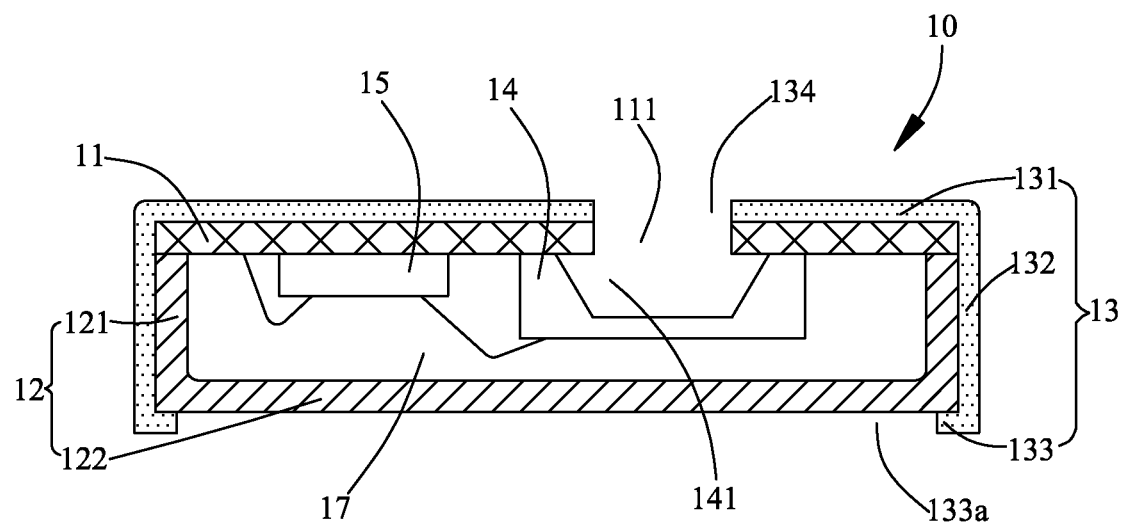
FIG. 1 is a cross-sectional view of a MEMS microphone in accordance with one embodiment of the present invention.

Referring to FIG. 1, a MEMS microphone 10 generally includes a cover 11, a housing 12, and a number of transducers. In this embodiment, the transducers include a MEMS die 14 and a controlling chip 15. The combination of the cover 11 and the housing 12 forms a cavity 17 for receiving the MEMS die 14 and the controlling chip 15. The cover 11 may be a printed circuit board. The MEMS die 14 defines a back volume 141. The cover 11 further defines an acoustic hole 111, and the MEMS die 14 is mounted on the cover 11 overlapping at least a portion of the acoustic hole 111. The back volume 141 of the MEMS die 14 is communicated with the acoustic hole 111.

The housing 12 includes a base 122 and a sidewall 121 extending perpendicularly from the base 122. The sidewall 121 connects with the cover 11.

The MEMS microphone 10 further includes a conductive case 13 covering the cover 11 and the sidewall 121 The conductive case 13 defines a first part 131 covering the cover 11, a second part 132 extending from the first part for covering the sidewall 121 and a third part 133 perpendicularly extending from the second part 132 for covering a periphery part of the base 122. While assembled, the third part 133 forms an opening 133a for exposing the base 122. The conductive case 13 includes an acoustic aperture 134 communicated with the acoustic hole 111 for receiving acoustic signals. By virtue of the conductive case 13, the transducers in the cavity 17 can be protected against the interference signals such as RFI signals, much like a Faraday cage.

Figure 3:
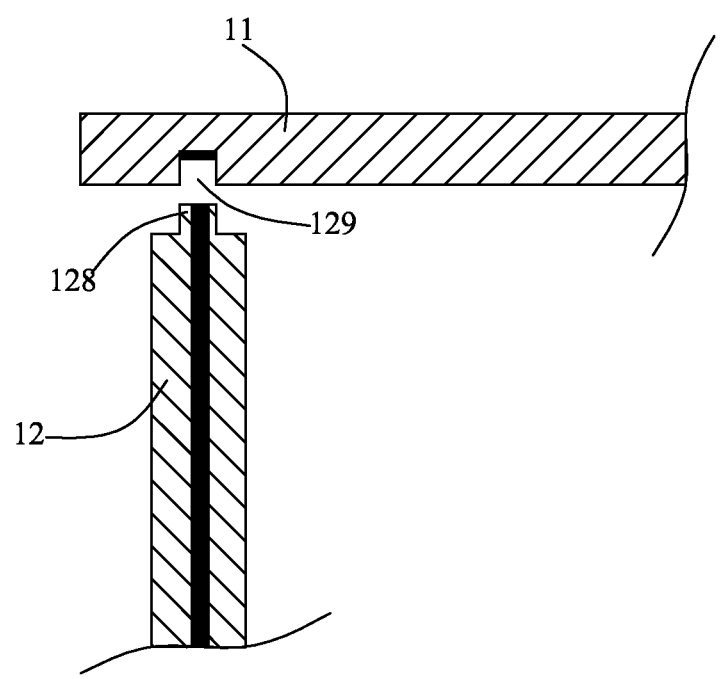
FIG. 3 is a schematic view showing the printed circuit board ready to be connected to a housing of the MEMS microphone.

The housing 12 may be made of ceramic materials and may be provided with circuits embedded therein for electrically connecting with the cover 11. Referring to FIG. 3, the black and thick lines in this drawing represent the circuits. Therefore, the MEMS microphone 10 can be electrically connected to a device, such as a mobile phone, with the base 122 mounted on the device.

Figure 2:
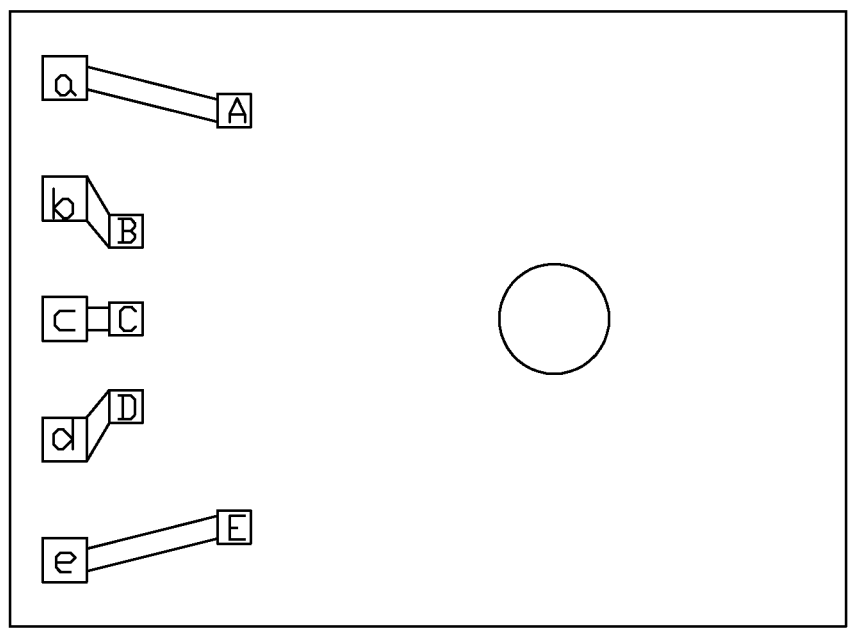
FIG. 2 is a schematic top view of a printed circuit board of the MEMS microphone.

Referring to FIG. 2, the cover 11 defines a first group of terminals for electrically connecting with the circuits embedded in the housing 12, and a second group of terminals for electrically connecting with the transducers. In one exemplary embodiment, the first group of terminals includes Terminal a, Terminal b, Terminal c, Terminal d, and Terminal e. The second group of terminals includes Terminal A, Terminal B, Terminal C, Terminal D, and Terminal E. Electrical signals produced by the transducers can be transmitted to the device via the second group of terminals, cover 11, the first group of terminals, and the housing 12.

Referring to FIG. 3, the housing defines a protrusion 128 at the top of the sidewall 121, and simultaneously, the cover 11 defines a recess 129 engaging with the protrusion 128, which enables the housing to be connected to the cover firmly. It should be easily understood that the protrusion can be defined on the cover, and the recess can be defined in the sidewall of the housing.

It can be easily understood that the MEMS microphone can be assembled on an external device, such as a mobile phone, with the cover mounted on the device.

While the present invention has been described with reference to specific embodiment, the description of the invention is illustrative and is not to be construed as limiting the invention. Various of modifications to the present invention can be made to the exemplary embodiment by those skilled in the art without departing from the true spirit and scope of the invention as defined by the appended claims.

What is claimed is:

1. A MEMS microphone, comprising:
a cover;

a housing engaging with the cover for forming a cavity, the housing comprising a base and a sidewall extending perpendicularly from the base;

at least one MEMS transducer accommodated in the cavity, the transducer having a back volume;

and a conductive case covering the cover and the sidewall of the housing for protecting the transducer against interference signals;

wherein the conductive case defines a first part covering the cover, a second part extending from the first part for covering the sidewall and a third part perpendicularly extending from the second part for covering a periphery part of the base, the third part forming an opening;

and wherein the cover is a printed circuit board, and the housing includes circuits embedded therein for electrically connecting with the cover;

and wherein the cover defines a recess, and the sidewall of the housing defines a protrusion for engaging with the recess.

2. The MEMS microphone as described in claim 1, wherein the cover defines an acoustic hole for receiving acoustic signals.

3. The MEMS microphone as described in claim 2, wherein the transducer is mounted on the cover and overlaps at least a portion of the acoustic hole.

4. The MEMS microphone as described in claim 2, wherein the back volume of the transducer communicates with the acoustic hole.

5. The MEMS microphone as described in claim 2, wherein the conductive case defines an acoustic aperture communicating with the acoustic hole.

6. The MEMS microphone as described in claim 1, wherein the cover defines a first group of terminals for electrically connecting with the circuits in the sidewall of the housing and a second group of terminals for electrically connecting with the transducer.

* * * * *